(12) United States Patent
Zokaee et al.

(10) Patent No.: US 12,385,975 B1
(45) Date of Patent: Aug. 12, 2025

(54) INTEGRATED CIRCUITS INCLUDING ERROR PROTECTION OF FIELDS IN TRANSFERRED INFORMATION AND FIELD-BASED ERROR SIGNALS AND RELATED METHODS

(71) Applicant: Ampere Computing LLC, Santa Clara, CA (US)

(72) Inventors: Farzane Zokaee, Portland, OR (US); Richard James Shannon, Portland, OR (US); Jared Eric Bendt, Hillsboro, OR (US); Sebastien Hily, Portland, OR (US)

(73) Assignee: Ampere Computing LLC, Santa Clara, CA (US)

( * ) Notice: Subject to any disclaimer, the term of this patent is extended or adjusted under 35 U.S.C. 154(b) by 11 days.

(21) Appl. No.: 18/440,701

(22) Filed: Feb. 13, 2024

(51) Int. Cl.
*G01R 31/3187* (2006.01)
*G06F 11/07* (2006.01)

(52) U.S. Cl.
CPC ...... *G01R 31/3187* (2013.01); *G06F 11/0745* (2013.01); *G06F 11/0769* (2013.01)

(58) Field of Classification Search
CPC ............. G01R 31/3187; G06F 11/0745; G06F 11/0769
See application file for complete search history.

(56) References Cited

U.S. PATENT DOCUMENTS

| 5,953,351 | A | * | 9/1999 | Hicks | G06F 11/1024 714/763 |
| 6,647,516 | B1 | * | 11/2003 | Rust | G06F 11/004 714/48 |
| 6,725,331 | B1 | * | 4/2004 | Kedem | G06F 11/2094 711/112 |
| 7,444,551 | B1 | * | 10/2008 | Johnson | G06F 11/0766 714/41 |
| 9,632,869 | B1 | * | 4/2017 | Lu | G06F 11/1052 |
| 11,327,836 | B1 | * | 5/2022 | Wu | G06F 11/1068 |

(Continued)

OTHER PUBLICATIONS

M. Zhu, L. Xiao, S. Li and Y. Zhang, "Efficient Two-Dimensional Error Codes for Multiple Bit Upsets Mitigation in Memory," 2010 IEEE 25th International Symposium on Defect and Fault Tolerance in VLSI Systems, Kyoto, Japan, 2010, pp. 129-135, (Year: 2010).*

(Continued)

*Primary Examiner* — Daniel F. McMahon
(74) *Attorney, Agent, or Firm* — Withrow & Terranova, PLLC (57) ABSTRACT

An integrated circuit (IC) employs error codes based on fields of data for protecting data transferred from a first circuit to a second circuit on the IC. Each bit of a generated error code is based on one or more fields of the data rather than on consecutive signal bits of a bus. Upon receiving the data in a second circuit, the error code is employed to determine whether the data has been transferred without an error. In case of an error, a response circuit generates an error signal having an error type corresponding to the data fields in which errors are detected. In some examples, the transferred data comprises a transaction request and the error signal indicates whether the transaction request has failed, the transaction request may be retried, or the transaction request may be completed despite the error.

31 Claims, 7 Drawing Sheets

(56) References Cited

U.S. PATENT DOCUMENTS

| | | | | |
|---|---|---|---|---|
| 2007/0271495 | A1* | 11/2007 | Shaeffer | G06F 11/1004 |
| | | | | 714/763 |
| 2015/0280748 | A1* | 10/2015 | Gendler | H03M 13/13 |
| | | | | 714/755 |
| 2018/0196710 | A1* | 7/2018 | Lyer | H04L 1/0045 |
| 2019/0272211 | A1* | 9/2019 | Colombo | G06F 11/0727 |
| 2021/0375383 | A1* | 12/2021 | Fuoco | G06F 11/0772 |
| 2022/0415426 | A1* | 12/2022 | Sforzin | G11C 29/42 |
| 2023/0325274 | A1* | 10/2023 | Nemati | G06F 11/106 |
| | | | | 714/764 |

OTHER PUBLICATIONS

M. M. R. Khan and M. S. Sadi, "An efficient error correction coding approach to tolerate soft error," 2012 15th International Conference on Computer and Information Technology (ICCIT), Chittagong, Bangladesh, 2012, pp. 500-505, (Year: 2012).*

* cited by examiner

| ERROR RESPONSE | ACTION |
|---|---|
| 602 | RECEIVER TERMINATES PROCESSING OF THE TRANSACTION. SYSTEM ERROR. |
| 604A | RECEIVER REPORTS TO SENDER THAT THE TRANSACTION WAS RECEIVED WITH AN ERROR. |
| 604B | RECEIVER SENDS MESSAGE TO SENDER INDICATING RETRY IS POSSIBLE. |
| 604C | TRANSACTION CAN BE COMPLETED WITH A DOWNGRADED FLOW, WHICH MIGHT RESULT IN A DEGRADATION OF PERFORMANCE. |
| 606 | FIELD NOT IMPORTANT TO THE TRANSACTION. THE TRANSACTION CAN BE COMPLETED. |

TABLE 600

INTEGRATED CIRCUITS INCLUDING ERROR PROTECTION OF FIELDS IN TRANSFERRED INFORMATION AND FIELD-BASED ERROR SIGNALS AND RELATED METHODS

FIELD OF THE DISCLOSURE

The technology of the disclosure relates to data transferred between functional blocks on an integrated circuit (IC) and, in particular, to data integrity in a processor on an IC.

BACKGROUND

Electronic devices, such as smartphones, tablets, laptops, and desktop computers include separate components for performing a variety of different functions. For example, data may be moved between a memory module, a processor, and peripheral interfaces, like a video display. The data transferred from one component to another may pass through contacts, pins, wires, mechanical connectors, bus cables, etc., each having its own failure rate. Thus, data transferred between components in an electronic device may be checked at each transfer to confirm its validity. As integrated circuits (ICs) have increased in capacity, more circuits are disposed on a same die, but the transfer of data between components on an IC is more reliable. Components, such as memory cells or logic circuits, may cause intermittent errors as they begin to fail, eventually leading to solid faults. High energy particles may also cause an occasional fault within an IC, even when there are no faulty components. For this reason, data transferred between circuits in an IC may also be checked, especially in ICs employed for purposes where data integrity is essential, such as human safety, financial security, and high-reliability networks. In some applications, resetting or rebooting the IC is not an acceptable response to the detection of an error.

SUMMARY

Aspects disclosed herein include integrated circuits (ICs) including error protection of fields in transferred information and field-based error signals. Related methods of error protection of data fields within an IC and field-based error signals are also disclosed. An exemplary IC employs error codes based on fields of data for protecting data transferred from a first circuit to a second circuit on the IC. Each error code comprises one or more error code bits based on one or more fields of the data, rather than on consecutive signal bits of a bus. Upon receiving the data in a second circuit, the error code is employed to determine whether the data has been transferred without an error. In case of an error, a response circuit generates an error signal having a response level corresponding to the data fields in which errors are detected. In some examples, the transferred data comprises a transaction request and the response level of the error signal indicates whether the transaction request has failed, the transaction request may be ignored or retried, or the transaction request may be completed despite the error.

In this regard, in one exemplary aspect, an IC die is disclosed. The IC die includes a first circuit configured to transfer first data to a second circuit, the first data including a plurality of fields, and generate a first error code including first error code bits. The second circuit of the IC die is configured to receive the first data and the first error code, detect a first error in a first one or more fields of the plurality of fields based on the first data and the first error code bits, and generate an error response indicating a first response level corresponding to the first data in the first one or more fields, wherein the first response level includes one of a plurality of response levels corresponding to the first data in the plurality of fields.

In another exemplary aspect, a method of a data transfer in an IC die is disclosed. The method includes transferring first data from a first circuit to a second circuit, the first data including a plurality of fields; and generating, by the first circuit, a first error code including first error code bits. The method also includes receiving, in the second circuit, the first data and the first error code; detecting, by the second circuit, a first error in a first one or more field of the plurality of fields based on the first data and the first error code; and generating, by the second circuit, an error response indicating a first response level corresponding to the first data in the first one or more fields, wherein the first response level includes one of a plurality of response levels corresponding to the first data in the plurality of fields.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuits (ICs), including error protection of fields in transferred information and field-based error signals. Related methods of error protection of data fields within an IC and field-based error signals are also disclosed. An exemplary IC employs error codes based on fields of data for protecting data transferred from a first circuit to a second circuit on the IC. Each error code comprises one or more error code bits based on one or more fields of the data, rather than on consecutive signal bits of a bus. Upon receiving the data in a second circuit, the error code is employed to determine whether the data has been transferred without an error. In case of an error, a response circuit generates an error signal having a response level corresponding to the data fields in which errors are detected. In some examples, the transferred data comprises a transaction request and the response level of the error signal indicates whether the transaction request has failed, the transaction request may be ignored or retried, or the transaction request may be completed despite the error.

Figure 1:
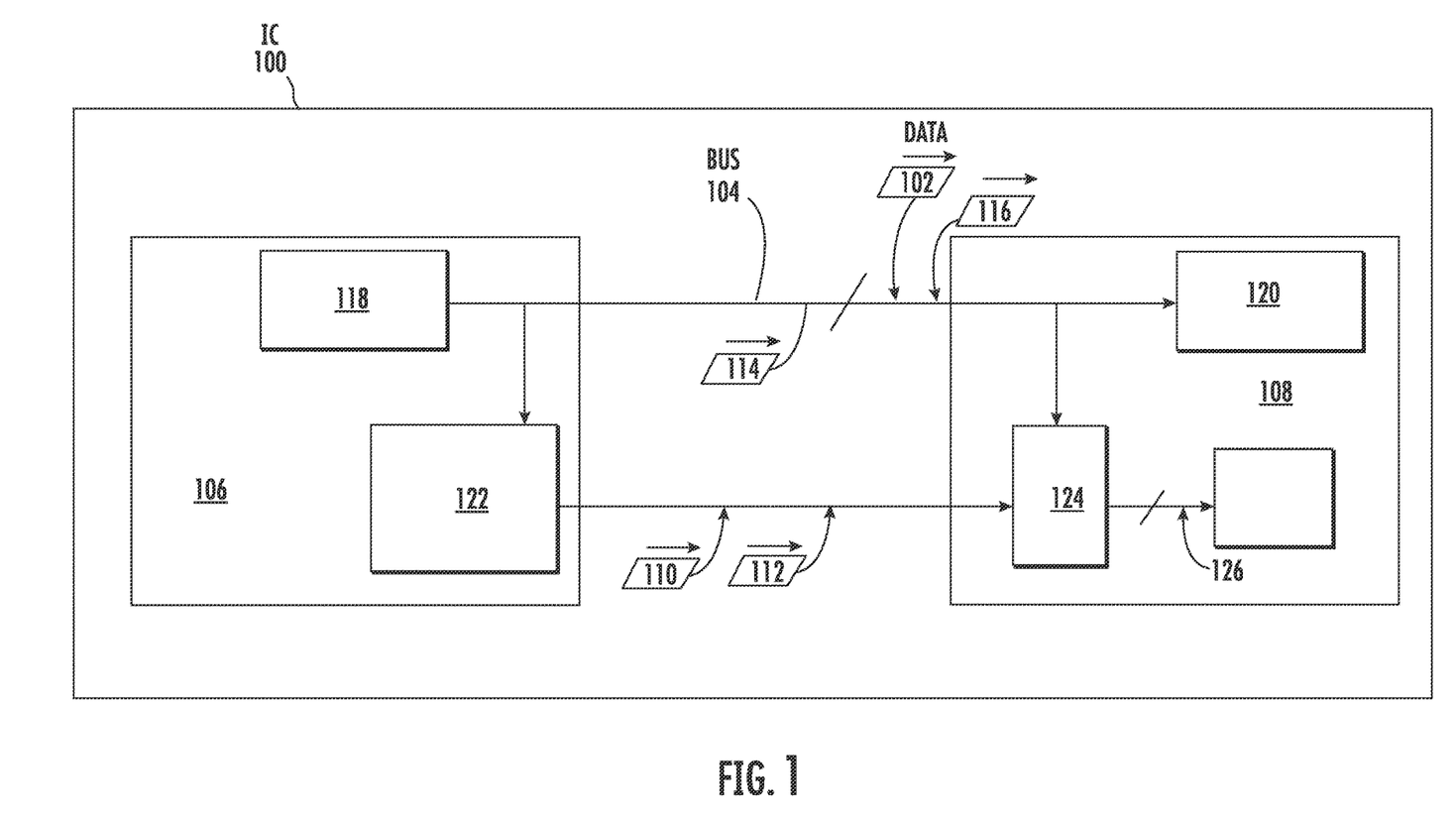
FIG. 1 is a diagram of an integrated circuit (IC) in which data transferred on a bus from a first circuit to a second circuit is protected by an error code comprising error bits based on consecutive signal bits of the bus.

FIG. 1 is a block diagram of an IC 100 in which data 102 is transferred on a bus 104 from a first circuit 106 to a second circuit 108. The transfer of data 102 is protected by an error code 110 comprising error code bits 112 based on some number of consecutive signal bits 114 of the bus 104. The data 102 comprises data bits 116, which may be transferred in parallel in signal bits 114 on the bus 104 from the first circuit 106 of the IC 100 to the second circuit 108 of the IC 100 in a cycle of a system clock (not shown). In this example, the error code 110 may be transferred on the bus 104 or on a separate bus as the data 102. In alternative examples, the error code 110 may be transferred in a same cycle or a different cycle than the cycle in which the data 102 is transferred.

The first circuit 106 includes a first functional circuit 118 that transfers the data 102 to a second functional circuit 120 of the second circuit 108. The first circuit 106 also includes an error code circuit 122 that receives the signal bits 114 and generates the error code 110 based on the signal bits 114. For example, a logical function (e.g., exclusive OR) or algorithm (parity or error protection code, such as an error correction code (ECC) or cyclic redundancy check (CRC), for example) may be employed to generate each error code bit 112 of the error code 110 based on a group (e.g., eight bits or a byte) of consecutive signal bits 114 of the bus 104. For example, a bus 104 having sixty-four (64) signal bits 114 may transfer up to 64 data bits 116 in a single clock cycle and the error code circuit 122 may generate an error code 110 having eight (8) error code bits 112, where each one of the error code bits 112 is based on eight signal bits 114. The data bits 116 may comprise various fields of different types of information or data, such as instructions or request fields, operand fields, metadata fields, system information fields, etc. having different lengths and concatenated together to form the data 102 driven on the 64 signal bits 114 of the bus 104. The error code circuit 122 groups every eight consecutive signal bits 114 to generate the error code bits 112 without regard to the fields or types of data 102 in the data bits 116 that are driven on the signal bits 114.

The first circuit 106 transfers the error code 110 to the second circuit 108 in conjunction with the data 102. The second circuit 108 includes an error detection circuit 124 that receives the data 102 and the error code 110. The error detection circuit 124 employs a logic function or algorithm, corresponding to the one used by the error code circuit 122 to generate the error code bits 112, to detect errors in the data 102. For example, the error detection circuit 124 may input a group of consecutive signal bits 114 (e.g., a byte) to the logic function or algorithm and compare the result to the error code bit 112 corresponding to the consecutive signal bits 114. The error detection circuit 124 may determine whether there is an error based on the comparison. Other means of error detection are also possible.

As in the error code circuit 122, the error detection circuit 124 is not aware of the data fields or types of data 102 contained in the consecutive signal bits 114 in which an error is detected. The error detection circuit 124 determines whether an error has been detected in any of the bytes of the data 102 and, if so, generates an error signal 126 indicating the error. Since the second circuit 108 may have no information about which of the data bits 116 of the data 102 is in error, the worst case is assumed and an error signal 126 is generated to indicate that the transfer has failed.

Figure 2:
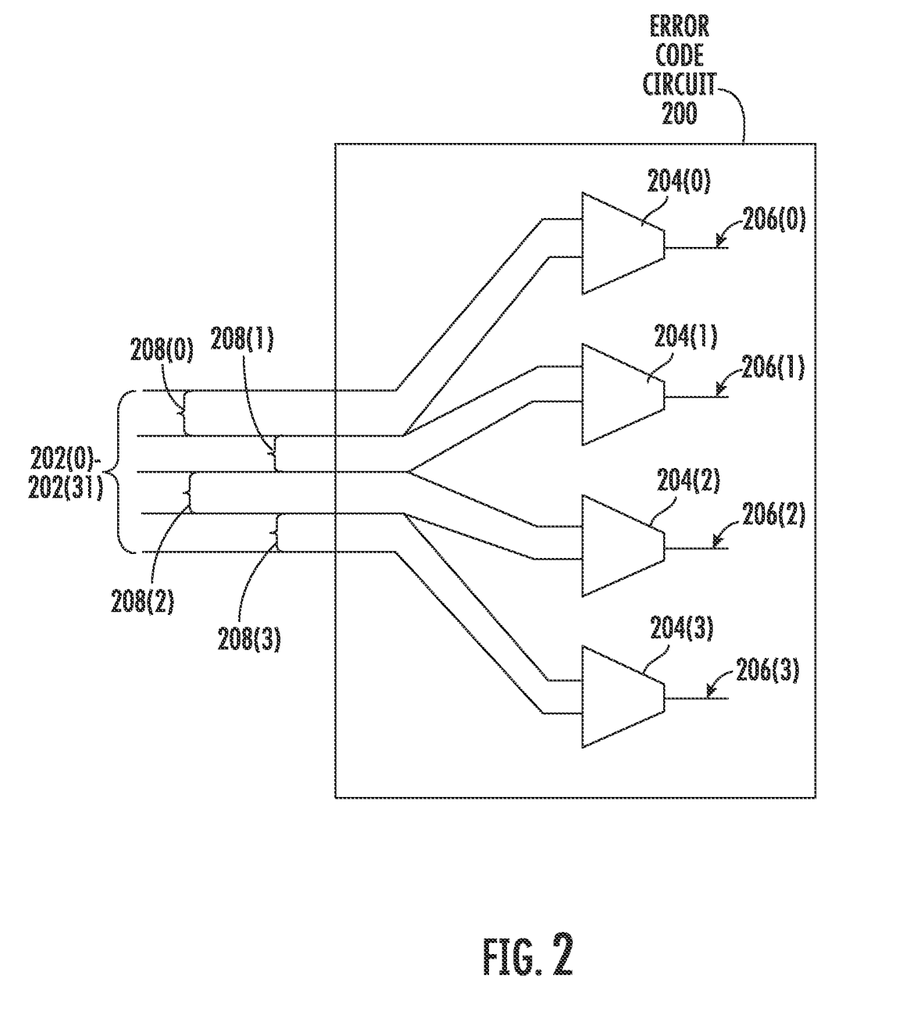
FIG. 2 is a diagram illustrating an error code circuit generating error code bits based on consecutive signal bits of a bus in the IC in FIG. 1.

FIG. 2 is a schematic diagram illustrating one example of an error code circuit 200 which may be included in the error code circuit 122 or in the error detection circuit 124 in FIG. 1. The error code circuit 200 is configured to generate error codes bits 112 based on consecutive signal bits 114 of the bus 104 in the IC 100 in FIG. 1, regardless of the types of data which may be transferred in those consecutive signal bits 114. In this example, signal bits 202(0)-202(31) may be thirty-two (32) of the signal bits 114 of the bus 104 in FIG. 1 and may be provided to the error code circuit 200. The error code circuit 200 also includes code bit generators 204(0)-204(3) and FIG. 2 shows that each of the code bit generators 204(0)-204(3) receives a group (e.g., a byte) of consecutive signal bits. For example, the error code bit generator 204(0) generates an error code bit 206(0) based on signal bits 202(0)-202(7). The error code bit 206(0) may be a parity bit based on the signal bits 202(0)-202(7). Similarly, the error code bit generators 204(1)-204(3) generate error code bits 206(1)-206(3) based on the signal bits 202(8)-202(15), 202(16)-202(23), and 202(24)-202(31), respectively. The error code circuit 200 allocates the signal bits 202(0)-202(31) in bytes 208(0)-208(3) of consecutive bits to the error code bit generators 204(0)-204(3) without knowledge of or consideration for the types or fields of data being driven on the bus 104. In some examples, the types of data transferred on the respective signal bits 114 may vary from cycle to cycle.

In the error detection circuit 124 in FIG. 1, the error code circuit 200 may receive the signal bits 202(0)-202(31) and generate new error code bits, which are compared to the error code bits 206(0)-206(3) received from the error code circuit 122. When the newly generated error code bits are different from the received error code bits 206(0)-206(3), an error signal 126 is generated. The error code bits 206(0)-206(3) may be employed in other manners to detect errors in the signal bits 202(0)-202(31) and this is just one example. In response to an error, the same error signal 126 is generated regardless of which of the error code bits 206(0)-206(3) indicates an error. In the error detection circuit 124, the error code bits 206(0)-206(3) may indicate which of the signal bits 202(0)-202(31) experienced an error but there is no correlation between the error code bits 206(0)-206(3) and the type of data in which the error occurs. Thus, the error codes bits 206(0)-206(3) do not indicate how critical or problematic the error is for the transaction. Thus, a worst-case scenario must be assumed, so an error detected on any of the signal bits 114 at the second circuit 108 in FIG. 1 causes an error signal 126 to be generated to indicate the transfer failed.

Figure 3:
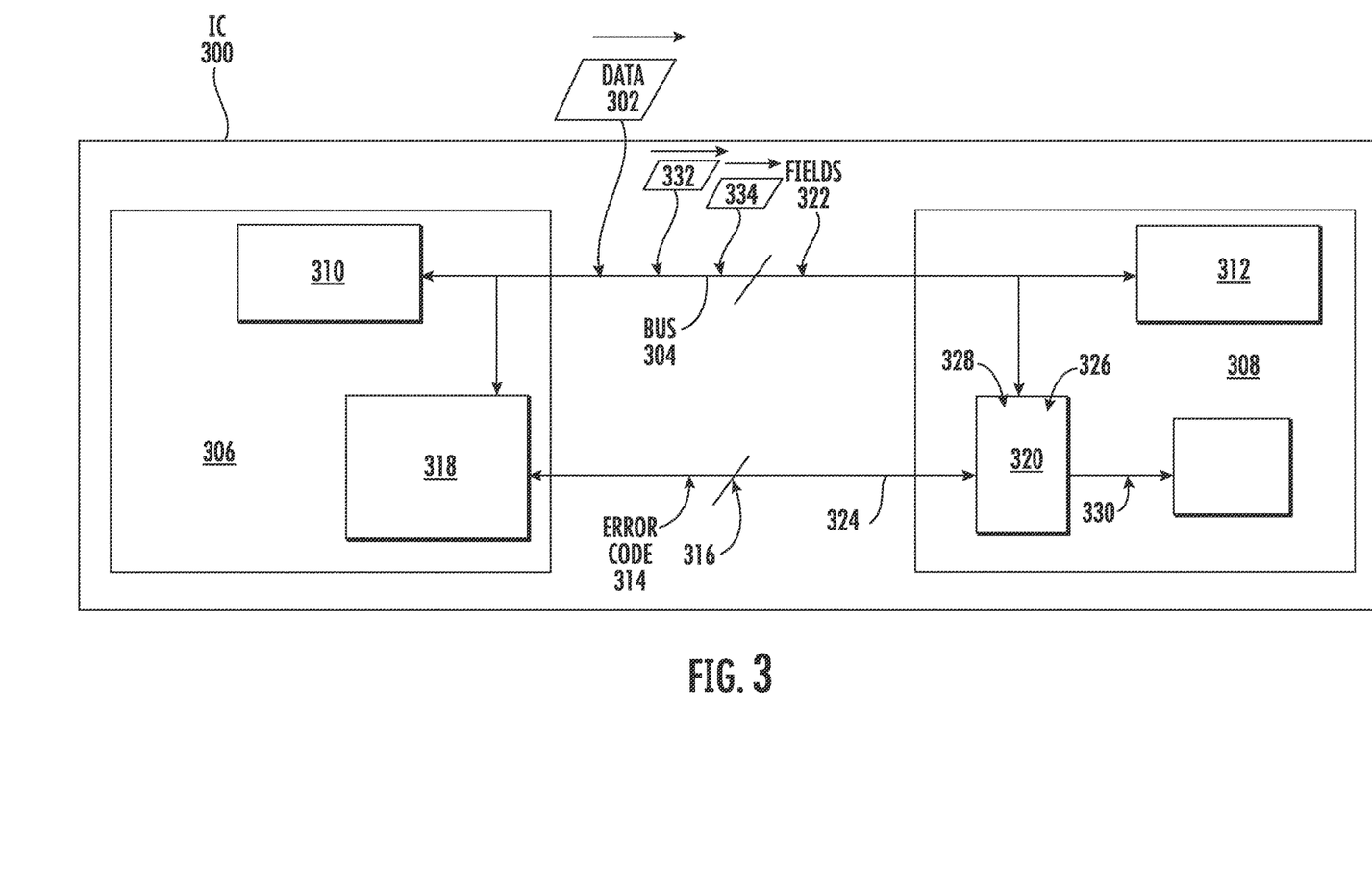
FIG. 3 is a diagram of an exemplary IC in which data transferred on a bus from a first circuit to a second circuit is protected by an error code comprising error bits based on one or more fields of the data and an error based on the data in one or more fields.

FIG. 3 is a block diagram of an exemplary IC 300 in which data 302 is transferred on a bus 304 from a first, transmitting circuit 306 to a second, receiving circuit 308. The first circuit 306 is configured to transfer the first data 302 to the second circuit 308 as frequently as once per cycle of a system clock CLK, where the first circuit 306 and the second circuit 308 may each be synchronized to the system clock CLK. The data 302 is transferred from a first functional circuit 310 in the first circuit 306 to a second functional circuit 312 in the second circuit 308. The transferred data 302 may be part of a transaction or may comprise a transaction request. The transfer of the data 302 is protected by a first error code 314 comprising first error code bits 316. The first error code 314 is generated in an error code circuit 318 in the first circuit 306 that receives the data 302 from the first functional circuit 310. The first data 302 includes a plurality of fields 322 of data having a particular type or importance to completion of the transaction. In an exemplary aspect, the first error code bits 316 are each based on the data in one or more of the fields 322.

The second circuit 308 includes an error detection circuit 320 that receives the data 302 that is received by the second functional circuit 312. The second circuit 308 also receives first error code 314 transferred from the error code circuit 318 to the error detection circuit 320 on an error signal 324. The error detection circuit 320 generates an error response 330 indicating a response level according to the data (e.g., the type of data) in the first one or more fields 322. The error response 330 may be determined by any appropriate error detection algorithm that is capable of recognizing one or more errors in the first data 302 based on the first data 302 and the error code 314. That is, in response to receiving the first data 302 and the error code 314, the error detection circuit 320 generates the error signal 324 that may indicate the presence of an error (e.g., one or more unexpected bit states in a multi-bit value). An "error code" 314 may be any value generated from the first data 302 (e.g., by an algorithm receiving the first data 302 as an input) that may be employed in the second circuit 308 to determine whether the first data 302 received in the second circuit 308 is different from the first data 302 used to generate the error code 314 in the first circuit 306.

One specific example of an error detection method and apparatus is described with reference to FIGS. 3 and 4, but the disclosure is not limited in this regard. In the example described in detail herein, a same algorithm is employed by a sending circuit and a receiving circuit and the results of each are compared, as explained. However, detection of an error in any of the fields 322 is not limited in this regard and other error detection schemes are anticipated alternatives.

As noted above, in the example described with reference to FIGS. 3 and 4, the error detection circuit 320 generates a second error code 326 including second error code bits 328. The second circuit 308 generates each of the second error code bits 328 based on one or more of the fields 322 of the data 302. The error detection circuit 320 in this example detects an error in a first one or more fields 322 based on a difference between one of the first error code bits 316 and a corresponding one of the second error code bits 328. In other error detection methods, an error code 314 may not be generated by the error detection circuit 320. Therefore, in such methods, a comparison of the error code 314 and a second error code is not employed to detect errors. However, in this example, the first error code 314 and the second error code 326 are generated in the same manner and, in the absence of errors in the data 302, should be identical to each other, such that each of the first error code bits 316 is based on a same one or more fields 322 as a corresponding bit of the second error code bits 328. The error detection circuit 320 generates an error response 330 indicating a response level according to the data (e.g., the type of data) in the first one or more fields 322.

Data in each one of the fields 322 has a particular type, where some fields may be of a same type and others are of different types. The type of data determines the error response level associated with the data. Each type of data may provide information on the transfer and/or an associated transaction. As explained in more detail below, some of the fields 322 contain data that is critical to completion of the transfer, such that an error in a critical field will cause the transfer to fail with no ability to recover or retry the transfer, while other fields 322 may contain data that is unused in a particular transfer, so errors therein can be ignored and the transaction completed successfully. In other examples, an error response level based on data in a particular one of the fields 322 may indicate that a transaction request can be retried.

In response to detecting an error, the error detection circuit 320 generates an error response 330 having a response level among a plurality of response levels that depends on the types of data in the one or more fields 322 and in particular, based on the criticality of the type or types of data in a field or fields that are determined to have an error. Thus, the error response 330 may comprise one or more bits indicating different response levels for errors in different fields. A number of bits in the error response 330 may depend on the number of data types or a number of levels of criticality attributed to each of such data types. When a single one of the first error code bits 316 is based on more than one of the fields 322, the fields 322 may be of a same type or a different type and the response level of the error response 330 may be determined according to the most important or critical type.

In some examples, the first circuit 306 may be an originator of a transaction request to the second circuit 308. In some examples, the first circuit 306 may be forwarding data or a transaction request originated in another circuit (not shown) to the second circuit 308, such as in a mesh network. In some examples, the first circuit 306 may be providing data 302 to the second circuit 308 in response to the second circuit 308 sending a request for such data 302 (e.g., to a memory controller (not shown)). The bus 304 represents any multi-bit bus employed for transferring binary information between circuits on an IC. Thus, the first circuit 306 and the second circuit 308 may implement any appropriate bus protocol on the bus 304. One example of a bus protocol that may be implemented on the bus 304 is the Coherent Hub Interface (CHI) architecture described in various AMBA protocol specifications from ARM Holdings.

According to a bus protocol, the data 302 may take different forms in different cycles. For example, in a first cycle of a multi-cycle transfer, the data 302 may be an instruction or header with fields including different types of information, such as a source identifier (ID) field to identify the originator of the transaction and a destination or target ID field. An instruction or header may include alternative or additional types of information indicating an instruction type field, a format field, a size field indicating the size of data being transferred, etc. In subsequent cycles, the data 302 may contain data fields, metadata fields, and/or reserved bits.

In another exemplary aspect, both the error code circuit 318 and the error detection circuit 320 are designed to adhere to the protocol implemented on the bus 304. Therefore, rather than merely checking for errors in bytes of the bus 304 in every cycle, the error code circuit 318 and the error detection circuit 320 keep track of the fields of the data 302 on the bus 304 according to the protocol in respective cycles of the system clock CLK.

Figure 4:
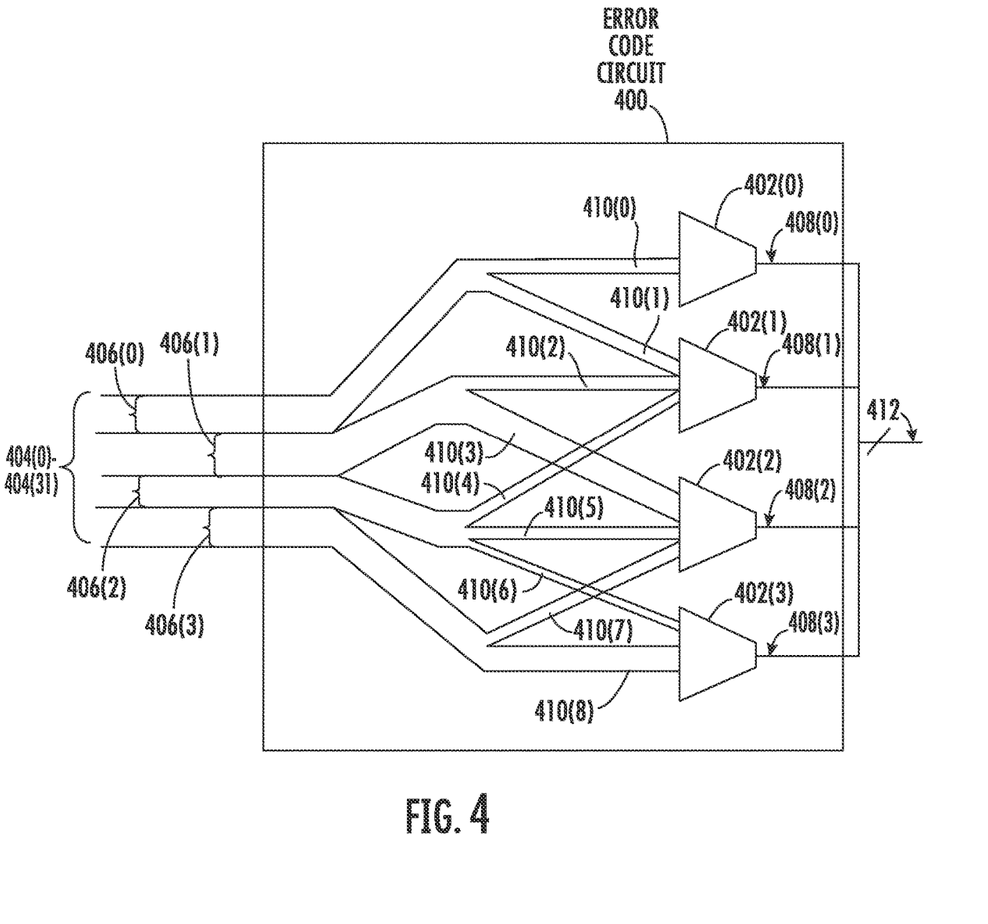
FIG. 4 is a diagram illustrating error code generators generating error code bits based on fields of data on a bus in the IC in FIG. 3.

Referring additionally to FIG. 4, an illustration of an error code circuit 400 is provided to show one example of a distribution of data 302 in fields 410(0)-410(X) provided to code bit generators 402(0)-402(Y). As discussed above, in the example of error detection circuit 320 disclosed herein, an error code 314 is generated in a sending circuit (first circuit 306) and an error code 326 is generated in a same manner in a receiving circuit (second circuit 308) and expected to match the error code 314. Thus, a same error code circuit may be employed in the first circuit 306 and the second circuit 308. The error code circuit 400 is an example of an error code circuit that may be employed for this error detection method, and details thereof are provided for purposes of distinguishing from the error code circuit 200 in FIG. 2.

As in the example in FIG. 2, the bus 304 may include thirty-two (32) signal bits 404(0)-404(31), which may also be referred to as bytes 406(0)-406(3), where each byte includes eight (8) consecutive signal bits. The first data 302 is transferred by the first circuit 306 to the second circuit 308 on the signal bits 404(0)-404(31). However, rather than generating error code bits 408(0)-408(Y) based on the bytes 406(0)-406(3) of consecutive signal bits, the fields 410(0)-410(X), where X=8, are distributed on the signal bits 404(0)-404(31), as shown in one example of a cycle in FIG. 4. That is, the signal bits 404(0)-404(31) are organized in fields 410(0)-410(X), where X may be any positive integer, and errors in the fields 410(0)-410(X) can be detected based on the error code bits 408(0)-408(Y). It should be understood that even though X=8 in this example, a number of the fields 410(0)-410(X) is not limited to 8 and may be any appropriate positive integer. Additionally, Y=3 in this example, but in other examples, the value of Y may be based on the number of fields 410(0)-410(X) (e.g., X+1) and on the error detection method or algorithm employed. Additionally, for example, each error code generator 402(0)-402(Y) may generate one or more error code bits and the number of error code bits generated by each of the respective error code generators 402(0)-402(Y) may depend on the number of bits received and on the error detection method or algorithm employed. The fields 410(0)-410(X) may vary from cycle to cycle, such that X may also vary. Each of the fields 410(0)-410(X) includes at least one of the signal bits 404(0)-404(31). The code bit generators 402(0)-402(Y) may receive data from fields 410(0)-410(8) that are disposed on non-consecutive signal bits of the signal bits 404(0)-404(31). Thus, at least one of the error code bits 408(0)-408(Y) may be based on at least two fields 410(0)-410(X) transferred on non-consecutive ones of the signal bits 404(0)-404(31). Some of the code bit generators 402(0)-402(Y) may receive data of a same type or same level of criticality in two or more fields 410(0)-410(8). In some examples, one of the code bit generators 402(0)-402(Y) may receive data of two or more different fields having data types with different levels of criticality, in which case a response level corresponds to the most critical data type received.

In an example in which the error code circuit 400 is employed in the error code circuit 318 in the IC 300 in FIG. 3, the first circuit 306 is configured to transfer the field 410(0) on the signal bits 404(0)-404(5). The code bit generator 402(0) receives field 410(0) and generates an error code bit 408(0). The first circuit 306 is configured to transfer the field 410(1) on the remaining signal bits 404(6)-404(7) of byte 406(0), where the field 410(1) may contain, for example, a different type of data from the field 410(0). The field 410(1) in this example may be a same type of data as the fields 410(2) and 410(4). The first circuit 306 is configured to transfer fields 410(2) and 410(4) on some of the signal bits 404(8)-404(23) in bytes 406(1) and 406(2). All of the fields 410(1), 410(2), and 410(4) are provided to the code bit generator 402(1) and an error code bit 408(1) is generated. The first circuit 306 transfers the field 410(3) on the byte 406(1), transfers field 410(5) on byte 406(2), and transfers field 410(7) on byte 406(4). The code bit generator 402(2) receives fields 410(3), 410(5), and 410(7) and generates an error code bit 408(2. The code bit generator 402(Y) is configured to generate the error code bit 408(Y) based on the fields 410(6) and 410(8), where Y=3 in the following description. The error code bits 408(0)-408(Y) may be based on different numbers of the signal bits 404(0)-404(31). For example, error code bit 408(1) may be based on a different number of signal bits 404(0)-404(31) than error code bits 408(0) and 408(2), which may be based on different numbers of bits. In some examples, the code bit generators 402(0)-402(Y) generate the error code bits 408(0)-408(Y) based on different fields and may generate the error code bits 408(0)-408(Y) based on different numbers of the signal bits 404(0)-404(31). At least one of the error code bits 408(0)-408(Y) may be based on two of the fields 410(0)-410(X) where a third one of the fields 410(0)-410(X) is disposed between them in the signal bits 404(0)-404(31).

The number (e.g., nine (9) in this example) of fields 410(0)-410(8) transferred in the signal bits 404(0)-404(31), may vary from cycle to cycle according to the implemented protocol. In addition, even if the number of fields remains the same from one cycle to the next, the sizes of the fields and the formatting or arrangement of the signal bits 404(0)-404(31) may change. Thus, FIG. 4 is merely one example of the distribution of data fields 410(0)-410(8) among the signal bits 404(0)-404(31) and one example of the distribution of those fields to the code bit generators 402(0)-402(3). In addition, although the number (Y=3) of code bit generators 402(0)-402(Y) generating an error code 412 is the same as the number of bytes 406(0)-406(3) shown in the example in FIG. 4, the error code circuit 400 is not limited in this regard. The error code 412 may be generated by any number of code bit generators. The number of code generators may be based on the number of different error response levels that may be generated based on a protocol and/or the number of signal bits in a bus.

The term "type" as used herein with reference to fields (e.g., fields (e.g., 410(0)-410(8))) may refer to a function or purpose for data in such fields. The term "type" may also refer to the significance or importance of the data in such field with regard to the second circuit 308 being able to complete a transfer or transaction in the presence of an error in data of that type. For example, without critical data, such as a source ID, a transaction may not be retried. Without a target ID, data cannot be successfully delivered.

With continued reference to both FIG. 3 and FIG. 4, the error detection circuit 320 may generate the error response 330 as a multi-bit signal that indicates a response level based on the data (e.g., the type of data) in the field(s) 322/410 in which an error has been detected. In some examples, the error response 330 may comprise separate signals. In some examples, the error response 330 may be provided to a system level circuit of the IC 300 to indicate a failure of the transaction due to an uncorrectable error, for example. As another example, the error response 330 may be provided to (e.g., only to) the first circuit 306 to request the data 302 be transferred again to the second circuit 308. Further details of the different types of data and corresponding response levels are discussed with reference to FIG. 6.

As noted above, the second circuit 308 may send a request for data 302, which may be directed to a memory controller (not shown). In response to a request for data stored in a memory, a memory controller accesses a memory circuit, which may also be on the IC 300. Alternatively, the memory controller may access a memory circuit that is external to the IC 300. In any case, the memory controller checks the data that is read from the memory. Checking the data may involve a parity check or other type of check, such as an error correction code (ECC) or cyclic redundancy check (CRC), for example. If an error is detected, the memory controller may return the requested data 302 even if it contains an error. The memory controller may also generate an error code based on the data, which may be used by the first circuit 306 to determine whether one or more errors were injected into the data 302 as it was transferred from the memory controller. In addition, in the case when the memory controller detects an error in the data 302 from the memory, the memory controller may also send, in a field of the transaction, a "poison" bit 334 indicating that the data 302 contains an error. In an example discussed above, the memory controller may forward the data 302 and the poison bit 334 to the first circuit 306 because the request for data 302 was sent to the first circuit 306 by the second circuit 308. The first circuit 306 may implement a bus protocol and error check as discussed above, and generate an interconnect error bit 332, indicating that an error in the data 302 was detected in the transfer. In such example, the first circuit 306 may provide both the poison bit 334 and the interconnect error bit 332 in the fields transferred to the second circuit 308 as part of the response to the data request.

In another example, the interconnect error bit 332 may be generated in the first circuit 306 even when the poison bit 334 is not set. In other words, even though the memory controller did not detect an error when the data 302 was read from the memory circuit, the first circuit 306 detected an error that may have occurred in the transfer from the memory controller to the first circuit. In this situation, in which the poison bit 334 is not set but the interconnect error bit 332 is set, the transaction may be retried or reissued, assuming that the error that caused the interconnect error bit 332 was a temporary or random error (e.g., due to a high energy particle striking the IC 300) and another attempt is likely to be successful. On the other hand, when the poison bit 334 is also set, a retry may not be attempted because the poison bit 334 may indicate that the data stored in memory contains the error, and a retry would also be unsuccessful.

In another example, the error code circuit 400 may be the error code circuit 200 in FIG. 2, where X=3, the fields 410(0)-410(X) are each one byte in width, and the types of data 302 may be different in each of the fields 410(0)-410(3).

Figure 5:
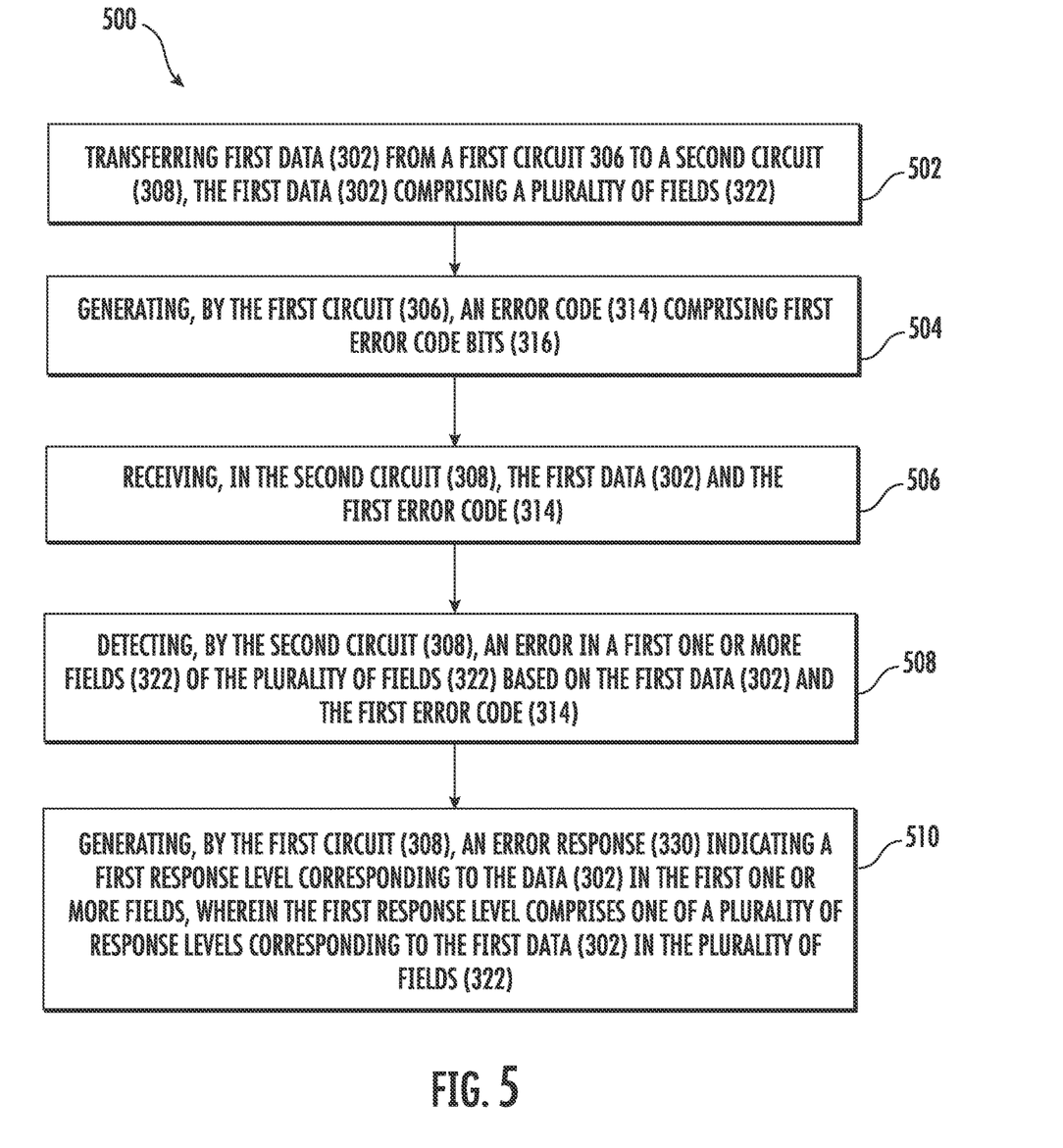
FIG. 5 is a flow chart of a method in the IC of FIG. 3 of protecting data transferred on a bus by employing an error code comprising error bits based on one or more fields of the data.

FIG. 5 is a flowchart of a method 500 of a data transfer in an IC 300. The method includes transferring first data 302 from a first circuit 306 to a second circuit 308, the first data 302 comprising a plurality of fields 322 (block 502). The method comprises generating, by the first circuit 306, an error code 314 comprising first error code bits 316 (block 504). The method further comprises receiving, in the second circuit 308, the first data 302 and the first error code 314 (block 506); and detecting, by the second circuit 308, an error in a first one or more fields 322 of the plurality of fields 322 based on the first data (302) and the first error code 314 (block 508). The method further includes generating, by the second circuit 308, an error response 330 indicating a first response level corresponding to the first data 302 in the first one or more fields, wherein the first response level comprises one of a plurality of response levels corresponding to the first data 302 in the plurality of fields 322 (block 512).

Figure 6:
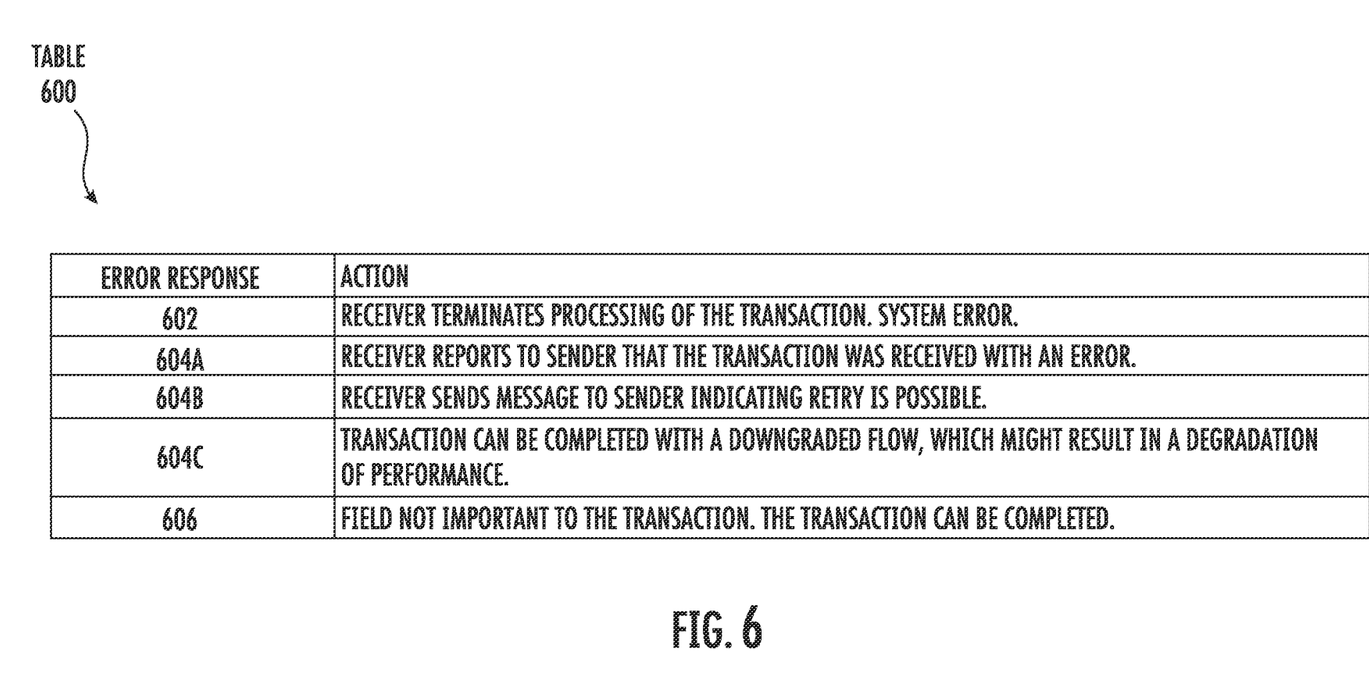
FIG. 6 is a chart of the error responses that may be generated for various types of data in fields where errors are detected and the corresponding actions in response to those errors.

FIG. 6 is a table 600 describing Error Responses 602, 604A-604C, and 606 corresponding to the different types of data that may be found in the fields 322 of the bus 304 in FIG. 3, where the type of data in this context is defined by the error response 330 indicated when there is an error detected in a field of that type. The description of the data in table 600 may refer to aspects of the IC 300 in FIG. 3 and the error code circuit 400 in FIG. 4. Table 600 identifies a brief description of associated Actions for each of the Error Responses 602, 604A, 604B, 604C, and 606.

Examples of data causing an error response 602 may include a target ID of a transaction request, which may be of high importance to completion of a transaction, and the transaction may not be retried by the first circuit 306. In response to errors in such data, the second circuit 308, which represents any receiver of a transfer in which an error is detected on the bus 304, may terminate processing of the transaction and generate an error response 602, which may comprise an error response indicating a system error. As an example, a system error may require a reset of the IC 300, a call to firmware/software handler(s), or at least an interrupt to a processor or error handling circuits.

Examples of data causing the error responses 604A, 604B, 604C include an operation code or instruction code (Op Code) of a transaction request. In some cases, the error detection circuit 320 is configured to send the error response 604A to the first circuit 306 indicating that the transaction was received with an error. In some of these cases, the transaction cannot be retried, so the first circuit 306 may cancel the transaction request. In some of these cases, the first circuit 306 is configured to retry the transfer or transaction request based on the error response 330 from the second circuit 308. In some cases, the first circuit 306 is configured to generate the error response 604B indicating to the first circuit 306 to retry the transfer or transaction request. In some cases, the error response 604C is generated to indicate that the transaction can be completed with a reduced performance level, for example.

An example of data causing an error response 606 is a reserved field or information not important to the transaction. Without such data, the transaction can still be completed. In this case, the error response 606 indicates completion of the transfer request. In some examples, an error on the TargetID of a transaction reaching a final circuit may not be important. In some examples, an error in a "performance" field, indicating a priority of a transaction, may reduce performance but not hamper functionality.

Figure 7:
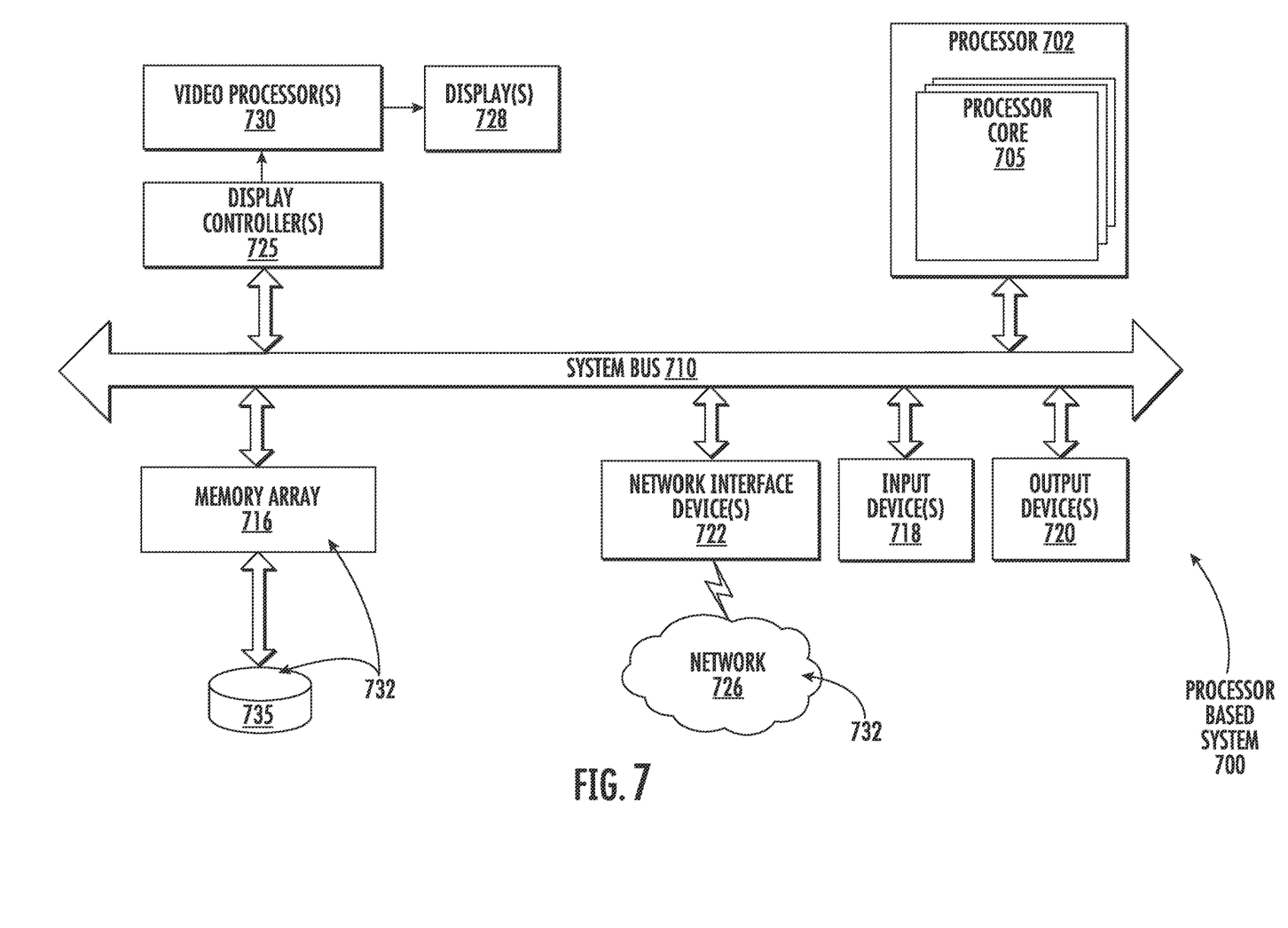
FIG. 7 is a diagram of an exemplary computer system that includes one or more ICs in which data transferred on a bus from a first circuit to a second circuit is protected by an error code comprising error bits based on one or more fields of the data and an error response based on the data in the one or more fields.

FIG. 7 is a block diagram illustrating an example of a processor-based system 700 that can include a processor 702, as a non-limiting example. The processor-based system 700 may include one or more instances of the IC 300 in FIG. 3. The processor 702 includes a system bus 710, that may be the bus 304 in FIG. 3.

Transfers of data on the system bus 710 may be protected by an error code circuit and an error detection circuit that generate error code bits and check error code bits, respectively, of fields of data transferred on the system bus 710, are designed to know which fields are present or may be present in each cycle based on an implemented bus protocol, and generate an error signal having an error response that is based on a type of data in a field in which an error is detected. As illustrated in FIG. 7, these devices can include the memory array 716. The devices coupled to the system bus 710 may also include one or more input devices 718, one or more output devices 720, one or more network interface devices 722, and one or more display controllers 725, as examples. The input device(s) 718 can include any type of input device, including, but not limited to, input keys, switches, voice processors, etc. The output device(s) 720 can include any type of output device, including, but not limited to, audio, video, other visual indicators, etc. The network interface device(s) 722 can be any device(s) configured to allow an exchange of data to and from a network 726. The network 726 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 722 can be configured to support any type of communications protocol desired.

The processor 702 may also be configured to access the display controller(s) 725 over the system bus 710 to control information sent to one or more displays 728. The display controller(s) 725 sends information to display(s) 728 to be displayed via one or more video processors 730, which process the information to be displayed into a format suitable for the display(s) 728. The display(s) 728 can include any type of display, including, but not limited to, a cathode ray tube (CRT), a liquid crystal display (LCD), a plasma display, a light emitting diode (LED) display, etc.

The memory array 716 of the processor-based system 700 may include a set of computer-readable instructions 732 stored in a non-transitory computer-readable medium 735 (e.g., a memory) that can be accessed by the processor 702 to be executed to perform tasks that require instructions and/or data from the memory array 716. These computer-readable instructions 732 can be stored in the non-transitory computer-readable medium 735. The computer-readable instructions 732 may further be transmitted or received over the network 726 via the network interface device 722, such that the network 726 includes the non-transitory computer-readable medium 735. The computer-readable instructions 732 may further be transmitted or received from the input device 718.

While the non-transitory computer-readable medium 735 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. For example, the initiator and target devices described herein may be employed in any circuit, hardware component, integrated circuit (IC), or IC chip. A processor is a circuit that can include a microcontroller, a microprocessor, or other circuits that can execute software or firmware instructions. A controller is a circuit that can include a microcontroller, a microprocessor, and/or dedicated hardware circuits (e.g., a field programmable gate array (FPGA)) that do not necessarily execute software or firmware instructions. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic devices, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of non-transitory computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. An integrated circuit (IC) die comprising:
a first circuit configured to:
transfer first data to a second circuit, the first data comprising a plurality of fields; and
generate a first error code comprising first error code bits; and
the second circuit configured to:
receive the first data and the first error code;
detect a first error in a first one or more fields of the plurality of fields based on the first data and the first error code bits; and
generate an error response indicating a first response level corresponding to the first data in the first one or more fields, wherein the first response level comprises one of a plurality of response levels corresponding to the first data in the plurality of fields.

2. The IC die of claim 1, further comprising a bus, wherein the first circuit is configured to:
transfer the first data to the second circuit on the bus; and
generate at least one of the first error code bits based on two non-consecutive fields of the plurality of fields of the first data transferred on the bus.

3. The IC die of claim 1, further comprising a bus comprising signal bits, wherein the first circuit is configured to:
transfer a first field of the plurality of fields on at least one first signal bit of the bus;
transfer a second field of the plurality of fields on at least one second signal bit of the bus;
transfer a third field of the plurality of fields on at least one third signal bit of the bus, the at least one third signal bit disposed between the at least one first signal bit and the at least one second signal bit; and
generate at least one of the first error code bits based on the first field and the second field.

4. The IC die of claim 1, wherein:
the first one or more fields comprises a first number of bits;
the first circuit is further configured to generate:
a second one of the first error code bits based on a second one or more fields of the plurality of fields comprising a second number of bits; and
the first number of bits is different from the second number of bits.

5. The IC die of claim 1, wherein:
the first data comprises a transaction request; and
the first response level indicates an uncorrectable system error.

6. The IC die of claim 1, wherein:
the first data comprises a transaction request; and
the first response level indicates to the first circuit that the transaction request comprises the first error.

7. The IC die of claim 6, wherein the first circuit is further configured to retry the transaction request based on the first response level.

8. The IC die of claim 6, wherein the first circuit is further configured to cancel the transaction request based on the first response level.

9. The IC die of claim 6, wherein the first response level indicates to the first circuit to retry the transaction request.

10. The IC die of claim 6, wherein the first response level indicates completion of the transaction request with reduced performance.

11. The IC die of claim 6, wherein the first response level indicates normal completion of the transaction request.

12. The IC die of claim 1, wherein the first circuit is further configured to:
receive the first data and a second error code from a memory controller;
receive a poison bit indicating whether the memory controller detected a memory error in the first data;
generate an interconnect error bit based on the second error code and the first data; and
provide the first data, the poison bit, and the interconnect error bit to the second circuit.

13. The IC die of claim 12, wherein in response to the interconnect error bit indicating the memory error in the first data, the second circuit is further configured to:
generate the error response indicating a system error in response to the poison bit indicating the memory controller detected the memory error in the first data.

14. The IC die of claim 13, wherein the second circuit is further configured to generate the error response indicating to the first circuit to retry the transaction request in response to the poison bit indicating no memory error was detected in the first data in the memory controller.

15. The IC die of claim 1, wherein:
the first data in each field of the plurality of fields comprises a data type different from the first data in every other field of the plurality of fields; and
the first response level is based on the data type of the first data in the first one or more fields in which the first error is detected.

16. The IC die of claim 15, wherein the second circuit is further configured to:
detect a second error in a second one or more fields of the first data based on the first error code and the first data; and
generate a second error response indicating a second response level of the plurality of response levels based on a second data type of the first data in the second one or more fields;
wherein the second response level indicates a more critical error than the first response level.

17. A method of a data transfer in an integrated circuit (IC) die, the method comprising:
transferring first data from a first circuit to a second circuit, the first data comprising a plurality of fields;
generating, by the first circuit, a first error code comprising first error code bits;
receiving, in the second circuit, the first data and the first error code;
detecting, by the second circuit, a first error in a first one or more fields of the plurality of fields based on of the first data and the first error code; and
generating, by the second circuit, an error response indicating a first response level corresponding to the first data in the first one or more fields, wherein the first response level comprises one of a plurality of response levels corresponding to the first data in the plurality of fields.

18. The method of claim 17, further comprising:
transferring the first data to the second circuit on a bus; and
generating at least one of the first error code bits based on at least two non-consecutive fields of the plurality of fields transferred on the bus.

19. The method of claim 17, further comprising:
transferring the first data to the second circuit on signal bits of a bus, comprising:
transferring a first field of the plurality of fields on at least one first signal bit of the bus;
transferring a second field of the plurality of fields on at least one second signal bit of the bus; and
transferring a third field of the plurality of fields on at least one third signal bit of the bus, the at least one third signal bit disposed between the at least one first signal bit and the at least one second signal bit; and
generating at least one of the first error code bits based on the first field and the second field.

20. The method of claim 17, further comprising:
generating a second one of the first error code bits based on a second one or more fields of the plurality of fields comprising a second number of bits;
wherein:
the first one or more fields comprises a first number of bits different from the second number of bits.

21. The method of claim 17, wherein:
the first data comprises a transaction request; and
the first response level indicates an uncorrectable system error.

22. The method of claim 17, wherein the first data comprises a transaction request and the method further comprises generating, by the second circuit, the first response level indicating to the first circuit that the transaction request comprises the first error.

23. The method of claim 22, further comprising the first circuit retrying the transaction request based on the first response level.

24. The method of claim 23, further comprising cancelling, by first circuit, the transaction request based on the first response level.

25. The method of claim 21, wherein the first response level indicates completion of the transaction request with reduced performance.

26. The method of claim 17, wherein the first response level indicates normal completion of the transaction request.

27. The method of claim 17, further comprising, in the first circuit:
receiving the first data and a second error code from a memory controller;
receiving a poison bit indicating whether the memory controller detected a memory error in the first data;
generating an interconnect error bit based on the second error code and the first data; and
providing the first data, the poison bit, and the interconnect error bit to the second circuit.

28. The method of claim 27, further comprising, in response to the interconnect error bit:
generating the error response indicating a system error in response to the poison bit, indicating the memory controller detected the memory error in the first data.

29. The method of claim 28, further comprising generating the error response indicating to the first circuit to retry the transaction request in response to the poison bit indicating no memory error was detected in the first data in the memory controller.

30. The method of claim 17, wherein:
the first data in each field of the plurality of fields comprises a data type different from the first data in every other field of the plurality of fields; and
the first response level is based on the data type of the first data in the first one or more fields in which the first error is detected.

31. The method of claim 30, further comprising:
detecting a second error in a second one or more fields of the first data based on the first error code; and
generating a second error response indicating a second response level of the plurality of response levels based on the data type of the first data in the second one or more fields;
wherein the second response level indicates a more critical error than the first response level.

* * * * *